United States Patent
Kawai et al.

(10) Patent No.: US 10,108,005 B2
(45) Date of Patent: Oct. 23, 2018

(54) OPTICAL SCANNER HAVING A VARIABLE FOCUS MIRROR

(71) Applicant: DENSO CORPORATION, Kariya, Aichi-pref. (JP)

(72) Inventors: Yusuke Kawai, Chiryu (JP); Kenichi Sakai, Aichi-gun (JP); Koichi Oyama, Nagoya (JP); Hideaki Nishikawa, Nagoya (JP)

(73) Assignee: DENSO CORPORATION, Kariya (JP)

( * ) Notice: Subject to any disclaimer, the term of this patent is extended or adjusted under 35 U.S.C. 154(b) by 334 days.

(21) Appl. No.: 14/831,996

(22) Filed: Aug. 21, 2015

(65) Prior Publication Data

US 2016/0054562 A1  Feb. 25, 2016

(30) Foreign Application Priority Data

Aug. 21, 2014 (JP) .................. 2014-168711

(51) Int. Cl.
*G02B 26/08* (2006.01)
*B81B 3/00* (2006.01)

(52) U.S. Cl.
CPC ............ *G02B 26/0825* (2013.01); *B81B 3/00* (2013.01); *G02B 26/0858* (2013.01)

(58) Field of Classification Search
CPC .. G02B 26/0825; G02B 26/0858; G02B 5/09; G02B 21/0048
See application file for complete search history.

(56) References Cited

U.S. PATENT DOCUMENTS

2015/0309307 A1* 10/2015 Naono ................. B81B 3/0043
  359/200.8
2016/0001044 A1*  1/2016 Rauch ............... A61M 25/0158
  606/108

FOREIGN PATENT DOCUMENTS

JP  2007-121944 A  5/2007
JP  2008-040240 A  2/2008

* cited by examiner

*Primary Examiner* — Darryl J Collins
*Assistant Examiner* — Journey Sumlar
(74) *Attorney, Agent, or Firm* — Posz Law Group, PLC

(57) ABSTRACT

An optical scanner includes a substrate having a rigid body and a beam, and a layered body having multiple layers, including a lower conductive layer, a interlayer insulation film and an upper conductive layer, the layered body layered on and protruding outward from the rigid body and the beam. The layered body is patterned to form a resonance scanner portion and a vari-focal mirror, the resonance scanner portion (i) made as a part of the layered body and (ii) having an actuator part, and the vari-focal mirror made as a part of the layered body. The layered body including the resonance scanner portion and the vari-focal mirror is patterned to form a mirror driving wire. In such structure, the size of the optical scanner is reduced, and a frequency change of the resonance scanner portion due to the voltage application to the mirror driving wire is suppressed.

8 Claims, 7 Drawing Sheets

OPTICAL SCANNER HAVING A VARIABLE FOCUS MIRROR

CROSS REFERENCE TO RELATED APPLICATION

The present application is based on and claims the benefit of priority of Japanese Patent Application No. 2014-168711, filed on Aug. 21, 2014, the disclosure of which is incorporated herein by reference.

TECHNICAL FIELD

The present disclosure generally relates to an optical scanner having a variable focus mirror.

BACKGROUND INFORMATION

As disclosed in a Japanese patent document JP 2008-40240 A (Patent document 1), an optical scanner having a following configuration is proposed, in which a forced scanning section, a resonance scanning section, a mirror part, and a fixed part are provided, and among which the mirror part is supported by the resonance scanning section and the resonance scanning section is supported by the forced scanning section. In such an optical scanner, an image formation position of the mirror part is scanned in two dimensions, according to an applied voltage to a piezoelectric film in the forced scanning section and the resonance scanning section.

More practically, the resonance scanning section is formed of an actuator part and a beam part, and the actuator part and the mirror part are connected by the beam part. Further, in such structure, the voltage is applied to the mirror part via the actuator part and the beam part, and the mirror part is driven at the resonant frequency that is based on a natural frequency of the beam part.

The optical scanner described above is capable of scanning the image formation position in two dimensions, and may be configured to scan the image formation position in three dimensions (3D). For example, a 3D image scanning apparatus may be realized by using a variable focus mirror part, (e.g., by using a piezoelectric film) as the mirror part.

More practically, a variable focus mirror part (a vari-focal mirror) may have a layered structure, in which a conductive base material supports a piezoelectric film and a mirror electrode and an electric potential difference is caused between the mirror electrode and the conductive base material, thereby applying a voltage to the piezoelectric film and varying the focus of the mirror part. Such a structure is easily manufactured by using a semiconductor manufacturing process for laying the piezoelectric film and the mirror electrode on the conductive base material.

Here, when making a 3D scanning optical scanner according to the above-described structure, a mirror driving wire connected to a mirror electrode for a voltage application to the piezoelectric film of a vari-focal mirror passes the resonance scanning section that surrounds the mirror part.

More practically, the mirror driving wire extends (i) from the forced scanning section outside of the resonance scanning section (ii) to the mirror part via the resonance scanning section having (a) the actuator part and (b) the beam part.

However, in the above-described structure of the vari-focal mirror, the resonance scanning section is also formed as a layered structure, in which the conductive base material supports the piezoelectric film and a resonance scanner electrode, and the mirror driving wire passing through the resonance scanning section also extends on the piezoelectric film. Specifically, in consideration of element size reduction, the mirror driving wire is simply put on the piezoelectric film. In such case, when applying a voltage to the vari-focal mirror through the mirror driving wire, the voltage is also applied to the piezoelectric film that lies between the mirror driving wire and the conductive base material, thereby causing a warpage or deformation of the piezoelectric film and altering the resonance frequency of the resonance scanning section, which is problematic to the optical scanner.

As a resolution to such a problem, the area size of the resonance scanning section may be expanded to protrude to an outside of the actuator part, and the mirror driving wire may be positioned at an outside of the resonance scanner electrode, and the actuator part and the mirror driving wire may be insulated from each other. However, to expand the resonance scanning section, extra space is required, which makes it difficult to reduce the size of the optical scanner.

SUMMARY

It is an object of the present disclosure to provide a 3D optical scanner, which is capable of varying the image formation position in three dimensions, to reduce a product volume/size by constructing the variable focus mirror with the piezoelectric film while preventing a resonance frequency to be affected by the voltage application to a mirror driving wire.

In an aspect of the present disclosure, an optical scanner includes a substrate having a rigid body and a beam, and a layered body having multiple layers, including a lower conductive layer, a interlayer insulation film and an upper conductive layer, the layered body layered on and protruding outward from the rigid body and the beam. The layered body is patterned to form a resonance scanner portion and a vari-focal mirror, the resonance scanner portion (i) made as a part of the layered body on the rigid body and on the beam and (ii) having an actuator part that is formed as an outward protrusion part of the layered body protruding from the rigid body, and the vari-focal mirror made as a part of the layered body on a rest part of the beam other than the resonance scanner portion and an outward protrusion part of the layered body protruding from the beam. The layered body including the resonance scanner portion and the vari-focal mirror is patterned to form a mirror driving wire that applies a mirror drive voltage to the vari-focal mirror, the mirror driving wire providing an electric current path extending from the vari-focal mirror and passing through the resonance scanner portion to an outside of the resonance scanner portion. The interlayer insulation film of the resonance scanner portion is made from a piezoelectric film. The interlayer insulation film of the mirror driving wire is made from a non-piezoelectric insulation film. Based on the above configuration, the layered body multiple parts of the optical scanner is patterned (i.e., etched) as the mirror driving wire that is arranged and extends from the resonance scanning portion to the vari-focal mirror through the inside of the resonance scanner portion, for the application of the mirror drive voltage, and the interlayer insulation film in the resonance scanner portion is made from the piezoelectric film, and the interlayer insulation film in the mirror driving wire is made from the non-piezoelectric insulation film.

Thus, the non-piezoelectric insulation film in the mirror driving wire serving as the interlayer insulation film should be free from the influence of the voltage application to the mirror driving wire for the drive of the vari-focal mirror, (i.e., the deformation of the mirror driving wire) is prevented, or is suppressed to very little magnitude. Therefore, the change of the resonance frequency of the resonance scanner portion due to the voltage application to the mirror driving wire is prevented. Further, the mirror driving wire extending and passing through the inside of the resonance scanner portion which is prevented from the influence of the change of the resonance frequency enables the volume reduction of the optical scanner by saving a detour route area for extending the wiring outside of the resonance scanner portion.

Further, in another aspect of the present disclosure, an optical scanner includes a substrate having a rigid body and a beam, and a layered body having multiple layers, including a lower conductive layer, a interlayer insulation film and an upper conductive layer, the layered body layered on and protruding outward from the rigid body and the beam. The layered body is patterned to form a resonance scanner portion and a vari-focal mirror, the resonance scanner portion (i) made as a part of the layered body on the rigid body and on the beam and (ii) having an actuator part that is formed as an outward protrusion part of the layered body protruding from the rigid body, and the vari-focal mirror made as a part of the layered body on a rest part of the beam other than the resonance scanner portion and an outward protrusion part of the layered body protruding from the beam. The substrate is provided as a semiconductor substrate, and the semiconductor substrate has the layered body formed on the semiconductor substrate with a non-conductive film interposed between the multiple layers of the layered body and the substrate. A part of the semiconductor substrate has a diffusion layer formed (at a position) under the resonance scanner portion, and the diffusion layer serves as a mirror driving wire that applies a mirror drive voltage to the vari-focal mirror, for providing an electric current path extending from the vari-focal mirror and passing under the resonance scanner portion to an outside of the resonance scanner portion.

Thus, the mirror driving wire may be formed by the diffusion layer. Such a structure is also capable of preventing the change of the resonance frequency in the resonance scanner portion, because the piezoelectric film is not formed at a position of the mirror driving wire, thereby structurally preventing the potential difference of the piezoelectric film from affecting the frequency.

Further, by providing the mirror driving wire at a position under the resonance scanner portion of the layered body, there is no need to have an expansion space for the resonance scanner portion to have a "detour route area" for the mirror driving wire, thereby enabling a volume reduction of the optical scanner.

In yet another aspect of the present disclosure, an optical scanner includes a substrate having a rigid body and a beam, and a layered body having multiple layers, including a lower conductive layer, a interlayer insulation film and an upper conductive layer, the layered body layered on and protruding outward from the rigid body and the beam. The layered body is patterned to form a resonance scanner portion and a vari-focal mirror, the resonance scanner portion (i) made as a part of the layered body on the rigid body and on the beam and (ii) having an actuator part that is formed as an outward protrusion part of the layered body protruding from the rigid body, and the vari-focal mirror made as a part of the layered body on a rest part of the beam other than the resonance scanner portion and an outward protrusion part of the layered body protruding from the beam. The layered body of multiple parts is patterned to serve as a mirror driving wire that applies a mirror drive voltage to the vari-focal mirror, the mirror driving wire providing an electric current path from the vari-focal mirror passing through an inside of the resonance scanner portion to an outside of the resonance scanner portion, and the interlayer insulation film of the resonance scanner portion and the mirror driving wire is made from the piezoelectric film. The vari-focal mirror receives an application of the mirror drive voltage via the mirror driving wire, and the resonance scanner portion receives a resonance scanning voltage that includes a reverse phase signal that cancels the change of the resonance frequency in the resonance scanner portion caused by the application of the mirror drive voltage to the vari-focal mirror.

According to the above configuration, the change of the resonance frequency due to the deformation of the piezoelectric film is cancelled, and the change of the resonance frequency of the resonance scanner portion due to the application of the mirror drive voltage to the mirror driving wire is prevented. Further, the mirror driving wire providing the above advantage, (i.e., preventing the resonance frequency change), is formed to extend in the inside of the resonance scanner portion. Therefore, there is no need to have an extra space, or an expansion space, for a detour route of the mirror driving wire outside of the resonance scanner portion. In other words, the volume reduction of the optical scanner is achieved.

BRIEF DESCRIPTION OF THE DRAWINGS

Objects, features, and advantages of the present disclosure will become more apparent from the following detailed description made with reference to the accompanying drawings, in which.

DETAILED DESCRIPTION

Figure 1:
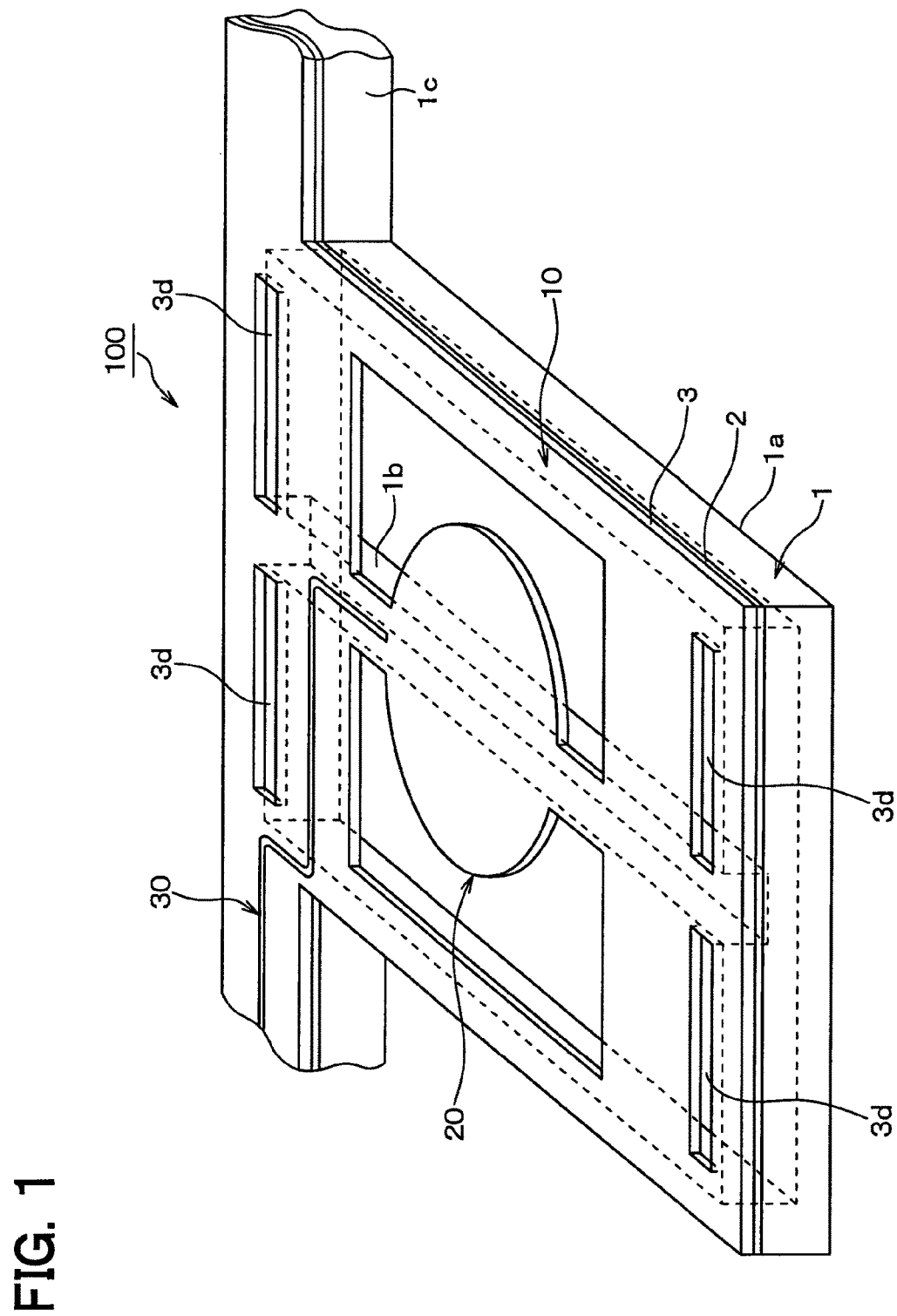
FIG. 1 is a perspective view of a light scanner in a first embodiment of the present disclosure.

Hereafter, the embodiment of the present disclosure is described based on the drawings. In each of the following embodiments, like numerals show like parts for the brevity of the description.

First Embodiment

The optical scanner in the first embodiment of the present disclosure is described with reference to FIGS. 1-4. Though FIG. 2 is not a sectional view, for the readability of the drawing, a hatching is partially used.

A optical scanner 100 shown in FIGS. 1-4 has a resonance scanner portion 10 and a variable focus mirror 20 together with other parts.

Figure 2:
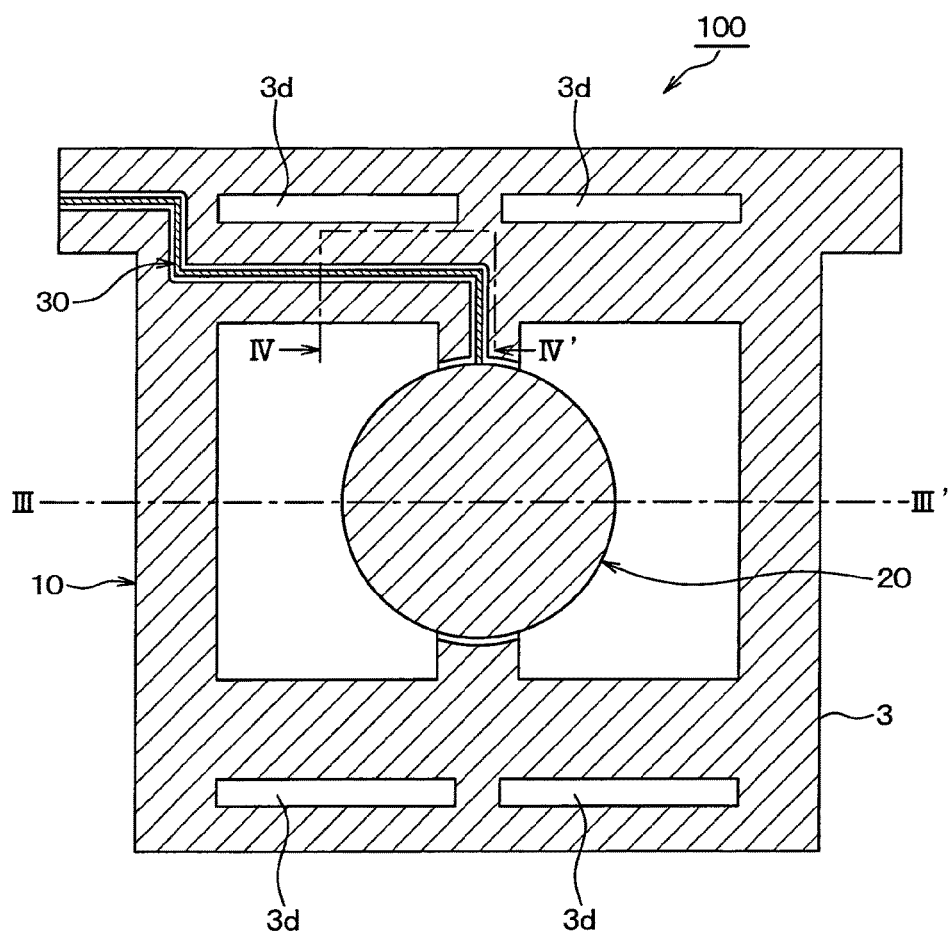
FIG. 2 is a top view of a layout pattern of the light scanner in FIG. 1.

In FIGS. 1 and 2, only the resonance scanner portion 10 and the variable focus mirror 20 are illustrated as the optical scanner 100, the optical scanner 100 has other parts, such as a forced scanning portion or a simple substrate (not illustrated) for supporting the scanner portion 10 and the mirror 20.

Figure 3:
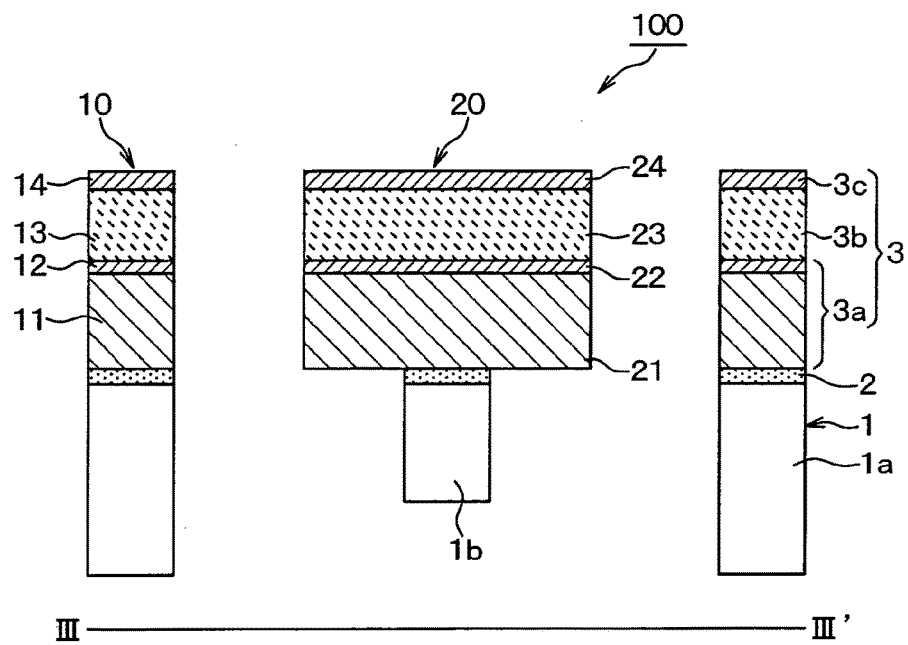
FIG. 3 is a sectional view of FIG. 2 along a section line III-III'.

The resonance scanner portion 10 and the variable focus mirror 20 are formed by patterning, (e.g., an etching of the same or similar patterns), of the layered body of multiple layers on the silicon-on-insulator (SOI) substrate. More specifically, as shown in FIG. 3, a layered body 3 formed by a lower conductive layer 3a, a interlayer insulation film 3b, an upper conductive layer 3c, etc. is formed on a silicon substrate 1 with an insulation film 2 interposed between the layered body 3 and the silicon substrate 1.

Among those layers, the silicon substrate 1, the insulation film 2, and the lower conductive layer 3a are provided as the SOI substrate. A rigid body 1a, a beam part 1b, and a supporter 1c are formed by the patterning of the silicon substrate 1, and the layered body 3 having multiple layers is formed on those parts, or is formed to protrude from those parts.

Further, the resonance scanner portion 10 and the variable focus mirror 20 are formed by the patterning of the layered body 3.

In the present embodiment, although an example of forming the silicon substrate 1, the insulation film 2, and the lower conductive layer 3a as a SOI substrate is described, only the silicon substrate 1 may be formed as the SOI substrate, and the insulation film 2 and the layered body 3 may be provided on the silicon substrate 1. Alternatively, without using the SOI substrate, the insulation film 2 and the layered body 3 may be simply put on the silicon substrate 1.

In the present embodiment, an outer shape of the resonance scanner portion 10 is a square, and a square opening is provided in an inside of the resonance scanner portion 10. Further, the resonance scanner portion 10 is supported by the forced scanning portion (not illustrated) or the substrate via the supporter 1c at the corners, which are located on both ends of one side (i.e., an upper side in FIGS. 1 and 2) of the outer shape of the scanner portion 10, or the substrate.

In the present embodiment, though not illustrated, the resonance scanner portion 10 is supported by the silicon substrate 1, which is enabled by leaving an outside of the silicon substrate 1 left un-etched, (i.e., the periphery of the silicon substrate 1 left un-etched) to be formed on and to protrude from the resonance scanner portion 10. Further, as shown by a dashed line in FIG. 1, the silicon substrate 1 is left as an outer frame of the resonance scanner portion 10 in the square shape, for the rigidity of the resonance scanner portion 10.

Figure 4:
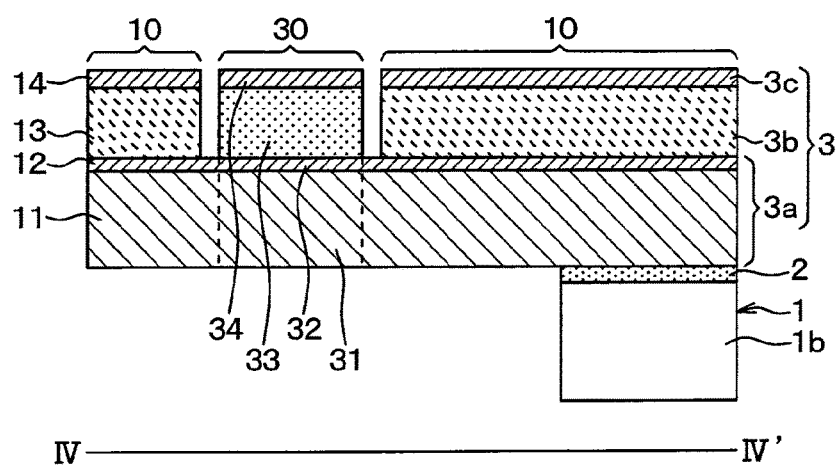
FIG. 4 is a sectional view of FIG. 2 along a section line IV-IV'.

As shown in FIGS. 3 and 4, the layered body 3 having multiple layers in the resonance scanner portion 10 is structured as a layering of a conductive base material 11, a ground film 12, a piezoelectric film 13, and a resonance scanner electrode 14.

The conductive base material 11 serves as a lower electrode layer, (i.e., formed as the lower conductive layer 3a), and is made from silicon (Si) doped with impurities such as aluminum (Al), platinum (Pt), or a conductive metal oxide. The conductive base material 11 extends to an outside of the resonance scanner portion 10, and is connected to the optical scanner 100 at a position outside of the optical scanner, which serves as a ground potential, or receives a resonance scan voltage is applied from an external power source. In the present embodiment, the conductive base material 11 is connected to a part used as the ground potential.

The ground film 12 is made of platinum (Pt), titanium (Ti), a conductive metal oxide, alumina, or the like. Since the ground film 12 is provided for a crystallinity of the conductive base material 11 that is formed on the piezoelectric film 13, the ground film 12 may be omitted when the piezoelectric film 13 having a good crystallinity is provided on the conductive base material 11.

Further, since the ground film 12 may also serve as a lower electrode layer, (i.e., may be formed as the lower conductive layer 3a), when the ground film 12 is made from a conductive layer, the conductive base material 11 may be replaced with an insulation base material in case that the ground film 12 serves as the lower electrode layer. That is, the ground film 12 may form a part of the lower electrode layer (i.e., a part of the lower conductive layer 3a), or the ground film 12 may form an entire lower electrode layer (i.e., the entire lower conductive layer 3a). On the contrary, the conductive base material 11 may form a part of the lower electrode layer (i.e., a part of the lower conductive layer 3a), or the conductive base material 11 may form an entire lower electrode layer (i.e., the entire lower conductive layer 3a).

The piezoelectric film 13 forms a part of the interlayer insulation films 3b, and is made of the piezoelectric material of general use, (e.g., by a titanic acid lead zirconate (PZT) film). The piezoelectric film 13 may be deformed or be warped when a potential difference is generated between the lower electrode layer formed as a lower layer of the piezoelectric film 13 and the upper electrode layer formed as an upper layer of the film 13.

The resonance scanner electrode 14 provides an upper electrode layer formed as the upper conductive layer 3c, and is made from gold (Au), platinum (Pt), or conductive metal oxide. The resonance scanner electrode 14 extends to an outside of the resonance scanner portion 10, and receives a resonance scan voltage applied thereto from an external power source, or is connected to the optical scanner 100 at a position outside of the optical scanner 100, which serves as a ground potential. In the present embodiment, the resonance scan voltage is applied to the resonance scanner electrode 14.

The resonance scanner portion 10 is formed as the above-described structure, and a part of the resonance scanner portion 10 inside the rigid body 1a, (i.e., a portion formed as a thin film) solely by the layered body 3, functions as an actuator part. That is, if the resonance scan voltage is applied to either of (i) the resonance scanner electrode 14 used as an upper electrode layer or (ii) the conductive base material 11 (or the ground film 12) used as a lower electrode layer, which results in a potential difference generated between the resonance scanner electrode 14 and the conductive base material 11, the piezoelectric film 13 in the actuator part deforms. In such manner, the actuator part is vibrated and a resonance vibration of the beam part 1b results, thereby making the high speed axis of the variable focus mirror 20 adjustable.

In the resonance scanner portion 10, although the thickness of the square frame of the rigid body 1a is considered as the thickness of the silicon substrate 1, the thickness of a beam part, (i.e., the beam part 1b) which connects the rigid body 1a and the variable focus mirror 20, may be adjusted to an arbitrary thickness. That is, since resonance vibration of the beam part 1b is caused by the vibration of the actuator part, thickness may be adjusted according to the resonance frequency of the resonance vibration.

In the present embodiment, a slit 3d that penetrates the layered body 3 is formed at both ends of the longitudinal direction of the beam part 1b, (i.e., at an upper part and a lower part) of the illustration of the mirror 20 in FIG. 2, in the resonance scanner portion 10. By forming such a slit 3d, the actuator part is separated from two sides that are located in the longitudinal direction of the beam part 1b, which are both on the far sides of each of the beam parts 1b at the upper part and the lower part. In other words, the upper frame and the lower frame of the rigid body 1a supporting the variable focus mirror 20 are separated from the actuator part. As such, the deformation of the actuator part is made easier.

The variable focus mirror 20 is arranged on an inside of the square opening of the resonance scanner portion 10, and is supported by the beam parts 1b arranged at the central part of two sides of the opening.

The layered body 3 having multiple layers in the variable focus mirror 20 is provided as a layering of a conductive base material 21, a ground film 22, a piezoelectric film 23, and a mirror electrode 24. The conductive base material 21, the ground film 22, the piezoelectric film 23, and the mirror electrode 24 are respectively the same as the conductive base material 11, the ground film 12, the piezoelectric film 13, and the resonance scanner electrode 14, which form the resonance scanner portion 10. That is, in the present embodiment, the resonance scanner portion 10 and the variable focus mirror 20 are formed by the patterning of the layered body 3 having multiple layers. In other words, the configuration of the conductive base material 11, the ground film 12, the piezoelectric film 13 and the resonance scanner electrode 14, and the configuration of the conductive base material 21, the ground film 22, the piezoelectric film 23, and the mirror electrodes 24 are the same.

For example, the ground film 22 provided as the conductive base material 21, (i.e., as a conductive layer), is formed by the lower conductive layer 3a, (i.e., as a lower electrode layer). The piezoelectric film 23 is formed by the interlayer insulation film 3b. The mirror electrode 24 is formed by the upper conductive layer 3c, (i.e., as an upper electrode layer).

However, at least one of the conductive base material 21 and the mirror electrodes 24 is electrically separated from the conductive base material 11 or from the resonance scanner electrode 14. For example, in the present embodiment, the mirror electrode 24 is electrically separated from the resonance scanner electrode 14. As such, different potentials are respectively applied to the mirror electrodes 24 and to the resonance scanner electrode 14.

Further, in the present embodiment, as shown in FIGS. 1 and 2, the mirror driving wire 30 extends from the variable focus mirror 20 to the outside of the resonance scanner portion 10, (i.e., from the variable focus mirror 20 through an inside of the resonance scanner portion 10, which is a position on the beam part 1b and the actuator part, and a position on the rigid body 1a, toward the outside of the resonance scanner portion 10).

As shown in FIG. 4, the mirror driving wire 30 is provided as a layering of the conductive base material 31, the ground film 32, the non-piezoelectric insulation film 33, and the surface conductive layer 34. Among these parts, the conductive base material 31, the ground film 32, and the surface conductive layer 34 are respectively the same as the conductive base material 21, the ground film 22, and the mirror electrodes 24 which form the variable focus mirror 20. That is, the ground film 32 provided as a layering of the conductive base material 31, (i.e., as a conductive layer), is formed by the lower conductive layer 3a, and serves a lower wiring layer. Further, the mirror electrode 24 is formed by the upper conductive layer 3c, and serves as an upper wiring layer.

On the other hand, the non-piezoelectric insulation film 33 forms a part of the interlayer insulation film 3b, the film 33 is made from a different material from the piezoelectric film 23, thereby not affected by the potential difference between the conductive base material 31 and the surface conductive layer 34, (i.e., not deformed by an application of the voltage between the conductive base material 31 and the surface conductive layer 34). For example, the non-piezoelectric insulation film 33 is made of a material, which is made from the silicon oxide (SiO2) or the piezoelectric film and treated by an ion doping process for decaying crystallinity, or treated by laser annealing for thermally degrading piezoelectricity. For example, when the piezoelectric film is made from PZT, piezoelectricity is degraded by evaporating a lead by laser annealing.

The conductive base material 31 is connected to the conductive base material 21 which serves as the lower electrode layer of the variable focus mirror 20, and forms the lower wiring layer which applies a desired voltage to the conductive base material 21. Further, the surface conductive layer 34 is connected to the mirror electrode 24 which serves as the upper electrode layer of the variable focus mirror 20, and forms the upper wiring layer which applies a desired voltage to the mirror electrodes 24.

In the present embodiment, by connecting the conductive base material 31 of the mirror driving wire 30 to a position outside of the optical scanner 100 that serves as the ground potential, the conductive base material 21 of the variable focus mirror 20 connected to the conductive base material 31 has the ground potential, for example. Further, the mirror drive voltage is applied to the mirror electrodes 24 of the variable focus mirror 20 via the connection to the surface conductive layer 34, which is enabled by an application of the mirror drive voltage to the surface conductive layer 34 of the mirror driving wire 30 from an external power source.

Further, as shown in FIGS. 2 and 4, at least one of the conductive base material 31 and the surface conductive layer 34 is electrically separated from the conductive base material 11 of the resonance scanner portion 10, or from the resonance scanner electrode 14. For example, in the present embodiment, a groove is provided at a position between the mid-layer conductor 34 and the resonance scanner electrodes 14. Thereby, different potentials are respectively applied to the surface conductive layer 34 and to the resonance scanner electrode 14.

Further, the surface conductive layer 34, which is made from the same material as the resonance scanner electrode 14 and the mirror electrodes 24 in the present embodiment, may also be made from different materials such as aluminum (Al), for example. Further, the groove between the surface conductor layer 34 and the resonance scanner electrode 14 reaching down to the conductive base materials 11 and 31 in FIG. 3 may be structured differently, (e.g., may only separate the surface conductor layer 34 and the resonance scanner electrode 14).

The optical scanner 100 in the present embodiment is provided as the above-described structure. The optical scanner 100 in such manner receives the resonance scan voltage applied, for example, to the resonance scanner electrode 14 of the resonance scanner portion 10 for the deformation of the piezoelectric film 13 in the actuator part, thereby causing the resonance vibration of the beam part 1b and performing the resonance scan about the high speed axis. Further, the piezoelectric film 23 in the variable focus mirror 20 is deformed by applying the mirror drive voltage to the mirror electrodes 24 of the variable focus mirror 20, for example, through the surface conductive layer 34 in the mirror driving wire 30. Thereby, the variable focus mirror 20 curves. That is, the variable focus mirror 20 in a planar state before voltage application, which is assumed as a level surface centered on a longitudinal line of the beam part 1b, curves at the voltage application time, and the curve of the mirror surface may be described as a half cylinder shape, (i.e., as the distance away from the longitudinal line of the beam part 1b increases, the height of the curved surface up above the level surface increases).

Although the surface of the variable focus mirror 20 before voltage application is assumed as a planar state in the above example, the surface may also be a convex shape, convexed at the center of the mirror 20, or may also be a concave shape, concaved at the center thereof. Further, the cylinder like curving of the mirror 20 may also be configured in a different manner, (e.g., a center part of the mirror 20 may be convexed up above the level surface with the periphery of the mirror stay un-raised from the level surface.

In the above-described manner, the focus of the variable focus mirror 20 is 3D scanned, (i.e., the image formation position of the light reflected by the variable focus mirror 20, (i.e., a vari-focal mirror), scans in three dimensions).

Further, in such optical scanner 100 that scans the image formation position in three dimensions, the mirror driving wire 30 is disposed to extend through the inside of the resonance scanner portion 10 from the variable focus mirror 20. Further, the groove is provided at a position between the surface conductor layer 34 of the mirror driving wire 30 and the resonance scanner electrode 14 to which the resonance scan voltage of the resonance scanner portion 10 is applied, for the insulation, and also not a piezoelectric film but the non-piezoelectric insulation film 33 is disposed between the surface conductor layer 34 and the conductive base material 31.

Thus, the non-piezoelectric insulation film 33 between the surface conductor layer 34 and the conductive base material is free from deformation at the voltage application time, (i.e., when a voltage is applied to the mirror driving wire 30 for the driving of the variable focus mirror 20, or is configured to deform by very little amount at such time).

Therefore, the change of the resonance frequency of the resonance scanner portion 10 due to the voltage application to the mirror driving wire 30 is prevented. Further, the mirror driving wire 30 having the above structure, (i.e., which is free from the change of the resonance frequency of the resonance scanner portion 10), is disposed to extend through the inside of the resonance scanner portion 10. Therefore, a space otherwise required for the detour of the mirror driving wire 30 away from and outside of the resonance scanner portion 10 is not required. Thus, the volume reduction of the optical scanner 100 is achieved.

Therefore, the optical scanner 100 having a 3D scanning capability of the image formation position is provided to have the variable focus mirror 20 made from the piezoelectric film 23, while reducing the product volume and preventing the change of the resonance frequency of the resonance scanner portion 10 at the time of voltage application to the mirror driving wire 30.

The optical scanner 100 of such a configuration may be manufactured by the following manufacturing methods, for example.

First, after orderly disposing, on the silicon substrate 1, the conductive base materials 11, 21, 31 and the ground films 12, 22, 32 (i.e., the lower conductive layer 3a) with the insulation film 2 interposed between the materials 11, 21, 31 and the silicon substrate 1, the piezoelectric films 13 and 23 are disposed as a film layered on such structure (i.e., as the interlayer insulation film 3b). Further, the material at a position where the mirror driving wire 30 is going to extend is replaced from the one of the piezoelectric films 13 and 23 to the one of the non-piezoelectric insulation film 33. For example, by performing an ion doping to the material of the piezoelectric films 13 and 23 at the position of the wire 30 or by performing a laser annealing to the material of the non-piezoelectric insulation film 33 at such position, for the decay of crystallinity or thermal degradation of piezoelectricity.

Alternatively, after etching a position where the mirror driving wire 30 is going to extend in the piezoelectric films 13 and 23 and filling the etched groove in the films 13 and 23 with the non-piezoelectric insulation film, the non-piezoelectric insulation film 33 may be provided by removing the unwanted part of such non-piezoelectric insulation.

Further, after forming a film of the resonance scanner electrode 14, the mirror electrode 24, and the surface conductive layer 34 on the piezoelectric films 13 and 23 and on the non-piezoelectric insulation film 33, the resonance scanner electrode 14, the mirror electrodes 24, and the surface conductive layer 34 are formed by patterning such electrodes and the layer on the resonance scanner electrode 14. Then, by etching the silicon substrate 1 from the back side, the rigid body 1a, the beam part 1b, the supporter 1c, etc. may remain un-etched as the structure patterns. Thereby, the optical scanner 100 concerning the present embodiment is formed.

Second Embodiment

The second embodiment of the present disclosure is described in the following. In the present embodiment, the configuration of the mirror driving wire 30 is changed from the first embodiment, with other parts remain unchanged therefrom. Therefore, the difference from the first embodiment is mainly described.

Figure 5:
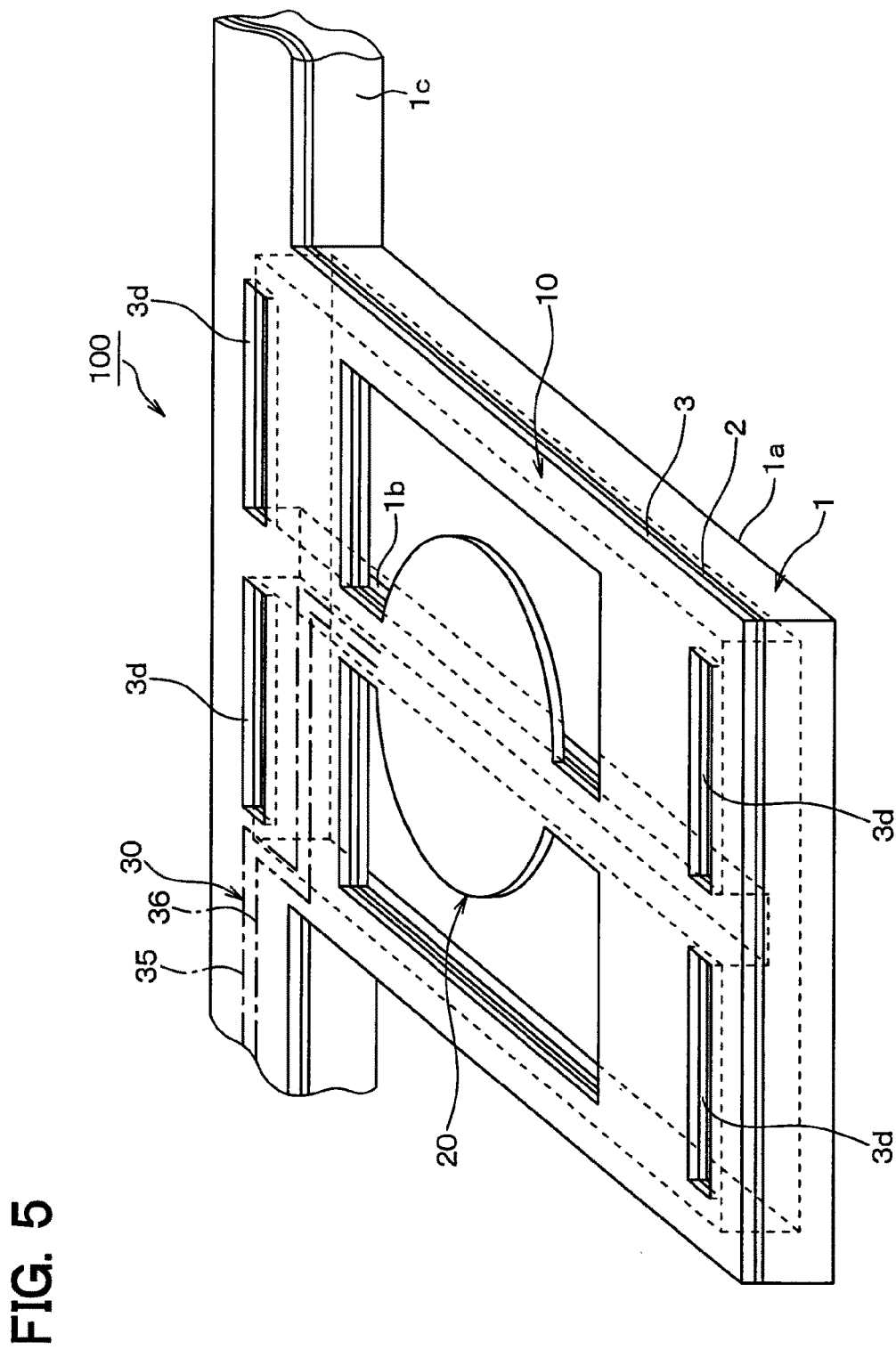
FIG. 5 is a perspective view the light scanner in a second embodiment of the present disclosure.
Figure 6:
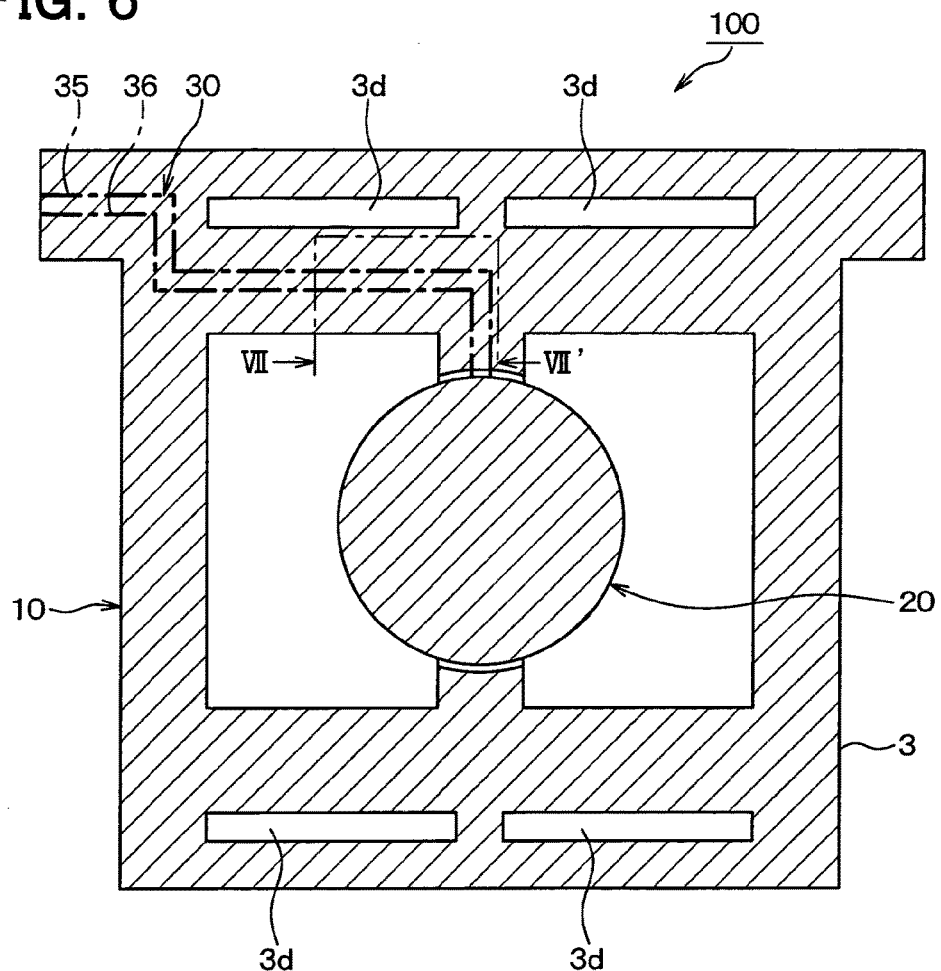
FIG. 6 is a top view of a layout pattern of the light scanner in FIG. 5.
Figure 7:
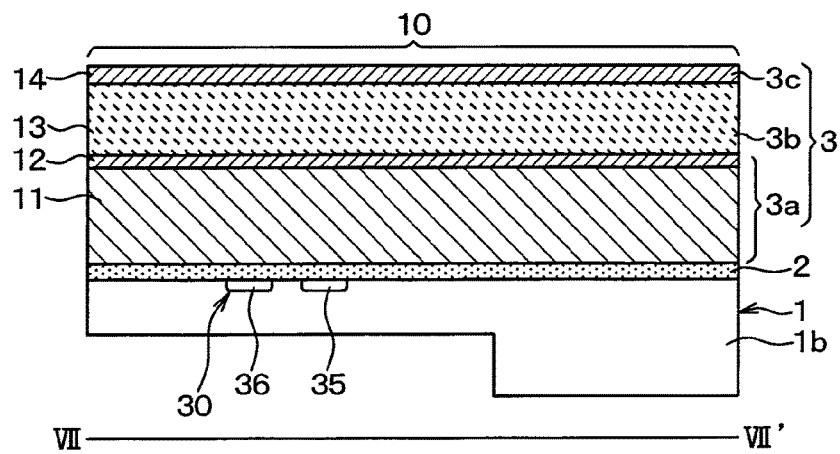
FIG. 7 is a sectional view of FIG. 6 along a section line VII-VII'.

With reference to FIGS. 5-7, the optical scanner 100 concerning the present embodiment is described.

As shown in FIGS. 5-7, the optical scanner 100 of the present embodiment is also formed as the layered body 3 having multiple layers on the silicon substrate 1 with the insulation film 2 interposed between the layered body 3 and the silicon substrate 1. However, the layered body 3 is used to provide only the resonance scanner portion 10 and the variable focus mirror 20, with the mirror driving wire 30 not made from the layered body 3.

As shown in FIG. 7, more practically, the silicon substrate 1 is left as a thinned part in the actuator part of the resonance scanner portion 10, which is elastically deformable, by thinning the substrate 1 relative to the rigid body 1a, and the surface of the thinned part of the substrate 1 is doped with the impurities to make a diffusion layer. Further, the diffusion layer is used to provide an upper wiring layer 35 and a lower wiring layer 36.

The upper wiring layer 35 is electrically connected to the mirror electrodes 24 which forms the upper electrode layer in the variable focus mirror 20, and the lower wiring layer 36 is electrically connected to the conductive base material 21 which forms the lower electrode layer in the variable focus mirror 20.

For example, the upper wiring layer 35 and the lower wiring layer 36 pass the lower part of the resonance scanner portion 10 in the layered body 3, and extend to a proximity of the variable focus mirror 20. Further, although not illustrated, at the proximity of the variable focus mirror 20, a contact hole is formed in the insulation film 2, and the lower wiring layer 36 is electrically connected to the conductive base material 21 through the contact hole.

Further, at the proximity of the variable focus mirror 20, a through hole is formed in the piezoelectric film 23 and the conductive base material 21, and the insulation is provided in the through hole by forming an insulation film, e.g. an oxide film, or the like. Further, the upper wiring layer 35 is electrically connected to the mirror electrode 24 by embedding a part of the mirror electrode 24 in the through hole.

Thus, the upper wiring layer 35 and the lower wiring layer 36, which form the mirror driving wire 30 may be formed as the diffusion layer. Even in such configuration, since the piezoelectric film is not disposed at a position between the upper wiring layer 35 and the lower wiring layer 36, the change of the resonance frequency of the resonance scanner portion 10 due to the voltage application to the mirror driving wire 30 is prevented despite the potential difference caused therein.

Further, the upper wiring layer 35 and the lower wiring layer 36 are disposed at a position under the resonance scanner portion 10 of the layered body 3, a space for expanding the area size of the resonance scanner portion 10 is not required, enabling the volume reduction of the optical scanner 100.

Although the upper wiring layer 35 and the lower wiring layer 36 are disposed, in the above description, at a position under the resonance scanner portion 10 of the layered body 3, the layered body 3 may be removed from a position above the upper wiring layer 35 and the lower wiring layer 36.

Further, regarding the upper wiring layer 35 and the lower wiring layer 36, if those layers 35, 36 are positioned under the resonance scanner portion 10 of the layered body 3, the surface of the silicon substrate 1 may be doped by ion injection of the impurities and thermal diffusion before forming the layered body 3. Further, for removing the layered body 3 from a position above the upper wiring layer 35 and the lower wiring layer 36, the insulation film 2 is also removed from a position where the layered body 3 is selectively removed. Further, at such removed portion, impurities may be ion injected and thermally diffused for forming the upper wiring layer 35 and the lower wiring layer 36. In such case, by providing a interlayer insulation film and an electrical connection wire, for example, an electrical connection between the lower wiring layer 36 and the conductive base material 21 as well as an electrical connection between the upper wiring layer 35 and the mirror electrodes 24 are established.

Further, the silicon substrate 1 is thinned at the actuator part of the resonance scanner portion 10 than the portion of the rigid body 1a, other structure, (e.g., no-thinning structure of the substrate 1) at such position is also usable.

Third Embodiment

The third embodiment of the present disclosure is described in the following. In the third embodiment, the configuration of the mirror driving wire 30 is changed from the first embodiment, and a drive method of the optical scanner 100 is also changed therefrom. Other configuration remains unchanged, thereby the description is focused to such changes.

Figure 8:
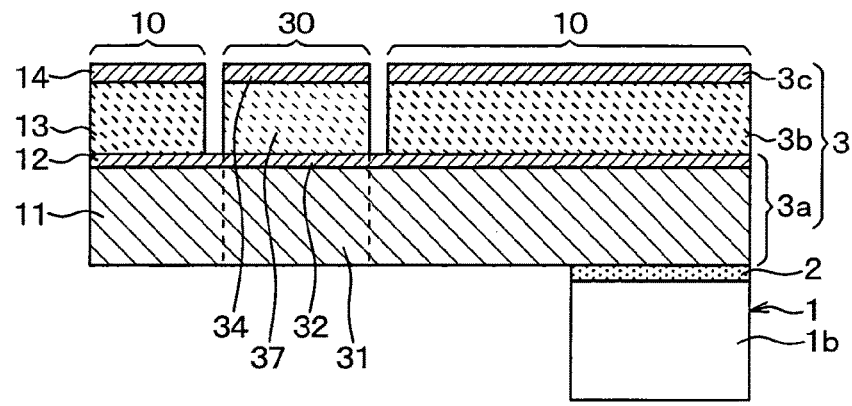
FIG. 8 is a sectional view of a mirror driving wire of the light scanner in a third embodiment of the present disclosure.

With reference to FIG. 8, the configuration of the optical scanner 100 concerning the present embodiment is described. The optical scanner 100 of the present embodiment has basically the same structure as the one in the first embodiment, which is a top view and a perspective view shown in FIGS. 1 and 2. However, as shown in FIG. 8, the structure of the mirror driving wire 30 is changed from the first embodiment. More practically, the non-piezoelectric insulation film 33 provided for the mirror driving wire 30 in the first embodiment is replaced with a piezoelectric film 37.

Thus, if a potential difference is generated between the surface conductor layer 34 and the conductive base material 31 in case of having the piezoelectric film 37, the piezoelectric film 37 may be deformed by such potential difference and the change of the resonance frequency may be caused. Therefore, in the present embodiment, when applying the mirror drive voltage to the mirror electrodes 24 of the variable focus mirror 20, an anti-phase signal is included in the resonance scan voltage applied to the resonance scanner portion 10 so that the resonance frequency change, which may be caused by the change of the piezoelectric film 37, may be cancelled. In such manner, the piezoelectric film 13 of the resonance scanner portion 10 is deformed so that the deformation of the film 13 cancels the resonance frequency change which may be caused by the change of the piezoelectric film 37.

Figure 9:
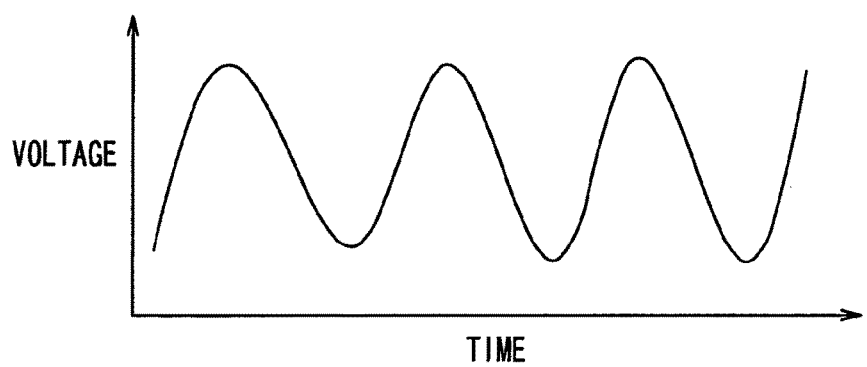
FIG. 9 is a waveform diagram of a mirror drive voltage applied to a variable focus mirror.
Figure 10:
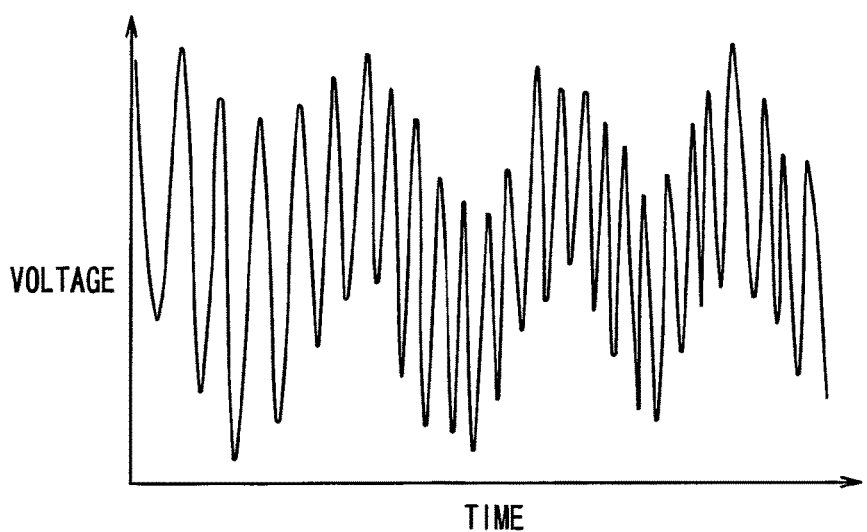
FIG. 10 is a waveform diagram of a resonance scan voltage applied to resonance scanner section.

As more specifically shown in FIG. 9, when the mirror drive voltage is applied to the variable focus mirror 20 is a sine wave, the resonance scan voltage which has a high frequency component added to the sine wave is applied to the resonance scanner portion 10 as shown in FIG. 10. In such manner, the resonance frequency change which may be caused by the change of the piezoelectric film 37 is cancelled, and the change of the resonance frequency of the resonance scanner portion 10 due to the voltage application to the mirror driving wire 30 is prevented. Further, the mirror driving wire 30 of the structured to prevent the change of the resonance frequency of the resonance scanner portion 10 in the above-described manner is disposed to extend through the inside of the resonance scanner portion 10. Therefore, in comparison to the case in which the mirror driving wire 30 is disposed as a detour route through the outside of the resonance scanner portion 10, there is no need to have an extra space which expands an area size of the resonance scanner portion 10, thus enabling the volume reduction of the optical scanner 100.

Other Embodiments

Although the present disclosure has been described in connection with preferred embodiment thereof with reference to the accompanying FIGS, it is to be noted that various changes and modifications will become apparent to those skilled in the art.

For example, in the first embodiment of the above as shown in FIG. 3, the piezoelectric film 13 in the resonance scanner portion 10 and the non-piezoelectric insulation film 33 in the mirror driving wire 30 are dispose on the same plane. However, they are not necessarily put on the same plane.

Figure 11A:
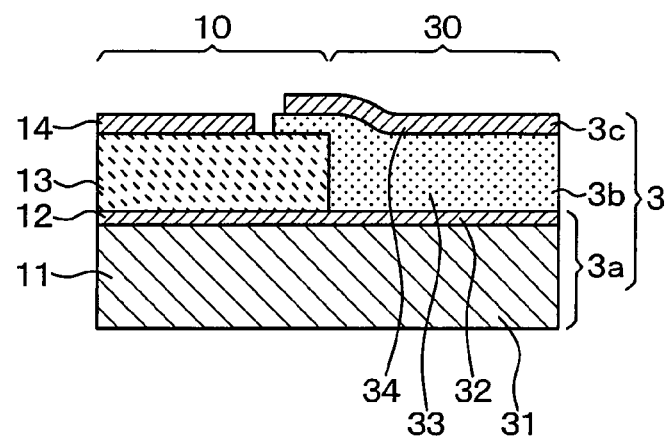
FIG. 11A is a sectional view of the mirror driving wire of the light scanner in other embodiments of the present disclosure.
Figure 11B:
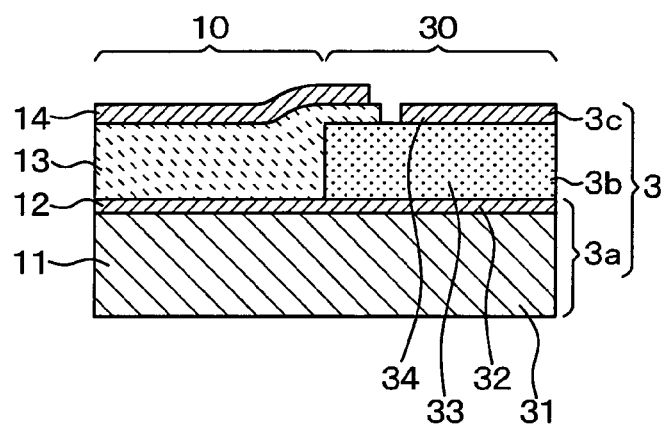
FIG. 11B is another sectional view of the mirror driving wire of the light scanner in other embodiments of the present disclosure.

For example, as shown in FIG. 11A, a part of the non-piezoelectric insulation films 33 may be formed on the piezoelectric film 13, and, as shown in FIG. 11B, a part of the piezoelectric film 13 may be formed on the non-piezoelectric insulation film 33. In both of those cases, after forming a film of the lower side and patterning the film to an intended shape, a film on the upper side may be formed and patterned. In such manner, the structures in FIGS. 11A and 11B are provided.

In the first embodiment described above, the mirror driving wire 30 is provided with the non-piezoelectric insulation film 33 for the entire part in the resonance scanner portion 10. However, the mirror driving wire 30 may be provided with the non-piezoelectric insulation film 33 at least for the actuator part, which elastically deforms when the resonance scan voltage is applied to the actuator part.

Further, the layouts of the mirror driving wire 30 described in each of the above-mentioned embodiments show only a few examples, and the mirror driving wire 30 may have different layouts other than the above. That is, the mirror driving wire 30 may have other layouts as long as the wire 30 extends from the variable focus mirror 20 to extend in an inside of the resonance scanner portion 10 to an outside of the resonance scanner portion 10, (i.e., from the mirror 20 to extend on the beam part 1b and the actuator part) to further extend on the rigid body 1a to go outside of the resonance scanner portion 10.

Similarly, shapes of other parts of the optical scanner 100, such as a shape of the upper surface and a shape of the other parts, may be arbitrarily formed, and may be made from other materials other than the one described in the above embodiments.

For example, the silicon substrate 1 used as a semiconductor substrate that forms the rigid body 1a, the beam part 1b, and the supporter 1c may be replaced with a substrate made from semiconductor material other than the silicon. Further, when a diffusion layer described in the second embodiment is not formed, the substrate 1 may be made from other materials other than the semiconductor material. Further, as described above, the silicon substrate 1 may be replaced with an SOI substrate. Further, in the first and third embodiments, the actuator part may have the silicon substrate 1 just like the second embodiment, (i.e., the silicon substrate 1 in a thinned form may be left in the actuator part).

Such changes, modifications, and summarized schemes are to be understood as being within the scope of the present disclosure as defined by appended claims.

What is claimed is:

1. An optical scanner comprising:
a substrate forming a rigid body and a beam; and
a layered body formed on the rigid body and the beam and
a portion of the layered body overhanging the rigid body and the beam, the layered body having multiple layers including a lower conductive layer, an interlayer insulation film, and an upper conductive layer, the interlayer insulation film in contact with and sandwiched between the lower conductive layer and the upper conductive layer, wherein
a portion of the layered body is patterned to form a resonance scanner portion, the resonance scanner portion formed on the rigid body and on a portion of the beam, the resonance scanner portion having a protruding portion that protrudes away from the rigid body and toward the beam to form an actuator part, and wherein
a portion of the layered body is patterned to form a vari-focal mirror on a remaining portion of the beam, a portion of the vari-focal mirror protruding away from the beam toward the rigid body, and wherein
a portion of the layered body is patterned to form a mirror driving wire, the mirror driving wire extending through and insulated from the resonance scanner portion to connect to the vari-focal mirror, the mirror driving wire configured to provide a drive voltage directly to the layered body directly at the vari-focal mirror to control a focus of the vari-focal mirror, and wherein
the interlayer insulation film of the resonance scanner portion is made from a piezoelectric film, and wherein
the interlayer insulation film of the mirror driving wire is made from a non-piezoelectric insulation film.

2. The optical scanner of claim 1, wherein
the interlayer insulation film of the mirror driving wire extending through at least the actuator part of the resonance scanner portion is made from the non-piezoelectric insulation film.

3. The optical scanner of claim 1, wherein
the non-piezoelectric insulation film in the mirror driving wire is made either by an ion injection method or by a laser annealing method.

4. The optical scanner of claim 1, wherein
the mirror driving wire is electrically insulated from the resonance scanner portion by a groove between the interlayer insulation film and the upper conductive layer of the mirror driving wire and the interlayer insulation film and the upper conductive layer of the resonance scanner portion.

5. An optical scanner comprising:
a substrate forming a rigid body and a beam, the substrate made of a semiconductor material; and
a layered body formed on the rigid body and the beam and
a portion of the layered body overhanging the rigid body and the beam, the layered body having multiple layers including a lower conductive layer, an interlayer insulation film, and an upper conductive layer, the interlayer insulation film in contact with and sandwiched between the lower conductive layer and the upper conductive layer, wherein
a portion of the layered body is patterned to form a resonance scanner portion, the resonance scanner portion formed on the rigid body and on a portion of the beam, the resonance scanner portion having a protruding portion that protrudes away from the rigid body and toward the beam to form an actuator part, and wherein
a portion of the layered body is patterned to form a vari-focal mirror on a remaining portion of the beam, a portion of the vari-focal mirror protruding away from the beam toward the rigid body, and wherein
a non-conductive film is interposed between the layered body and the substrate, and wherein
a part of the substrate under the resonance scanner portion is doped with impurities to form at least one diffusion layer, the at least one diffusion layer configured to form a mirror driving wire extending through the substrate and under the resonance scanner portion to connect to the vari-focal mirror, the mirror driving wire configured to provide a drive voltage directly to the layered body directly at the vari-focal mirror to control a focus of the vari-focal mirror.

6. The optical scanner of claim 5, wherein
a thickness of the substrate varies such that the thickness of the substrate under the actuator part is thinner than the thickness of the rigid body, and wherein
the mirror driving wire is formed to pass under the actuator part.

7. An optical scanner comprising:
a substrate forming a rigid body and a beam; and
a layered body formed on the rigid body and the beam and
a portion of the layered body overhanging the rigid body and the beam, the layered body having multiple layers including a lower conductive layer, an interlayer insulation film, and an upper conductive layer, the interlayer insulation film in contact with and sandwiched between the lower conductive layer and the upper conductive layer, wherein a portion of the layered body is patterned to form a resonance scanner portion, the resonance scanner portion formed on the rigid body and on a portion of the beam, the resonance scanner portion having a protruding portion that protrudes away from the rigid body and toward the beam to form an actuator part, and wherein a portion of the layered body is patterned to form a vari-focal mirror on a remaining portion of the beam, a portion of the vari-focal mirror protruding away from the beam toward the rigid body, and wherein a portion of the layered body is patterned to form a mirror driving wire, the mirror driving wire extending through and insulated from the resonance scanner portion to connect to the vari-focal mirror, the mirror driving wire configured to provide a drive voltage directly to the layered body directly at the vari-focal mirror to control a focus of the vari-focal mirror, and wherein the interlayer insulation film of the resonance scanner portion and the mirror driving wire is made from a piezoelectric film, and wherein when the drive voltage is provided to the vari-focal mirror, the resonance scanner portion receives a resonance scanning voltage that includes a reverse phase signal that cancels a resonance frequency change in the resonance scan portion caused by the drive voltage.

8. The optical scanner of claim 7, wherein the mirror driving wire is electrically insulated from the resonance scanner portion by a groove between the interlayer insulation film and the upper conductive layer of the mirror driving wire and the interlayer insulation film and the upper conductive layer of the resonance scanner portion.

\* \* \* \* \*